US011257869B2

(12) United States Patent
Luo et al.

(10) Patent No.: US 11,257,869 B2
(45) Date of Patent: Feb. 22, 2022

(54) PIXEL ARRANGEMENT STRUCTURE, DISPLAY PANEL, DISPLAY DEVICE EACH HAVING GROUPS OF SUB-PIXELS WITH EACH TYPE OF SUB-PIXEL INCLUDING FOUR SUB-PIXELS OF THE SAME COLOR

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Chang Luo, Beijing (CN); Zhongying Yang, Beijing (CN); Jianpeng Wu, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 537 days.

(21) Appl. No.: 16/308,907

(22) PCT Filed: Mar. 13, 2018

(86) PCT No.: PCT/CN2018/078775
§ 371 (c)(1),
(2) Date: Dec. 11, 2018

(87) PCT Pub. No.: WO2018/223740
PCT Pub. Date: Dec. 13, 2018

(65) Prior Publication Data
US 2021/0225953 A1 Jul. 22, 2021

(30) Foreign Application Priority Data
Jun. 9, 2017 (CN) .......................... 201710431715.6

(51) Int. Cl.
*H01L 27/32* (2006.01)
*C23C 14/04* (2006.01)
(Continued)

(52) U.S. Cl.
CPC ........ *H01L 27/3218* (2013.01); *C23C 14/042* (2013.01); *G02F 1/133514* (2013.01); *G02F 1/134336* (2013.01); *H01L 51/56* (2013.01)

(58) Field of Classification Search
CPC . H01L 27/3218; H01L 27/3216; H01L 51/56; C23C 14/042; G02F 1/133514; G02F 1/134336
See application file for complete search history.

(56) References Cited

U.S. PATENT DOCUMENTS 8,846,547 B2    9/2014  Sung et al.
2007/0024183 A1*  2/2007  Lih .......................... H01L 51/56
                                            313/504
(Continued)

FOREIGN PATENT DOCUMENTS

CN   104393012 A   3/2015
CN   104576695 A   4/2015
(Continued)

OTHER PUBLICATIONS

Search Report and Written Opinion for International Application No. PCT/CN2018/078775 dated Jun. 14, 2018.
(Continued)

*Primary Examiner* — Michael Jung
(74) *Attorney, Agent, or Firm* — Calfee, Halter & Griswold LLP

(57) ABSTRACT

A pixel arrangement structure is disclosed including a plurality of repeatedly arranged groups of sub-pixels. Each group of sub-pixels includes: one first sub-pixel and two second sub-pixels sequentially arranged in an i-th column, i being a natural number; two third sub-pixels and one first sub-pixel sequentially arranged in an (i+1)-th column; two second sub-pixels and one first sub-pixel sequentially arranged in an (i+2)-th column; and one first sub-pixel and two third pixels sequentially arranged in an (i+3)-th column.
(Continued)

Also disclosed is a display panel including pixels arranged in accordance with the pixel arrangement structure, a display device including the display panel, and a set of masks for vapor-depositing an organic luminescent material in fabricating an organic luminescent display panel.

12 Claims, 11 Drawing Sheets

(51) Int. Cl.
    *G02F 1/1335* (2006.01)
    *G02F 1/1343* (2006.01)
    *H01L 51/56* (2006.01)

(56) References Cited

U.S. PATENT DOCUMENTS

| | | | | |
|---|---|---|---|---|
| 2008/0061305 A1* | 3/2008 | Kim | G02F 1/133514 | 257/89 |
| 2011/0291549 A1* | 12/2011 | Kim | H01L 27/3218 | 313/504 |
| 2012/0293695 A1* | 11/2012 | Tanaka | G06T 3/4015 | 348/280 |
| 2016/0055781 A1* | 2/2016 | Phan | G09G 3/2003 | 345/690 |
| 2017/0343867 A1* | 11/2017 | Su | G09G 3/3607 | |
| 2017/0352710 A1 | 12/2017 | Hong et al. | | |
| 2018/0053812 A1* | 2/2018 | Wacyk | H01L 51/0011 | |
| 2018/0182827 A1* | 6/2018 | Kim | H01L 27/3258 | |

FOREIGN PATENT DOCUMENTS

| | | |
|---|---|---|
| CN | 104752488 A | 7/2015 |
| CN | 107068731 A | 8/2017 |

OTHER PUBLICATIONS

First Office Action for Chinese Patent Application No. 201710431715.6 dated Mar. 19, 2019.

\* cited by examiner

US 11,257,869 B2

PIXEL ARRANGEMENT STRUCTURE, DISPLAY PANEL, DISPLAY DEVICE EACH HAVING GROUPS OF SUB-PIXELS WITH EACH TYPE OF SUB-PIXEL INCLUDING FOUR SUB-PIXELS OF THE SAME COLOR

CROSS-REFERENCE TO RELATED APPLICATIONS

The present application is the U.S. national phase entry of PCT/CN2018/078775, with an international filing date of Mar. 13, 2018, which claims the benefit of the Chinese Patent Application No. 201710431715.6 filed on Jun. 9, 2017, the entire disclosures of which are incorporated herein by reference.

TECHNICAL FIELD

The present disclosure generally relates to the field of display technology, and in particular, to a pixel arrangement structure, a display panel including pixels arranged in accordance with the pixel arrangement structure, a display device including the display panel, and a set of masks for vapor-depositing an organic luminescent material in fabricating an organic luminescent display panel.

BACKGROUND

The organic luminescent display (e.g., an organic light-emitting diode (OLED) display) is considered to be a promising display device. Small molecule evaporation using a fine metal mask (FMM) is widely used to fabricate OLED displays. FMM evaporation can affect the quality of OLED displays (e.g., pixel resolution), and the design of the FMM is closely related to the way pixels are arranged in the display.

SUMMARY

According to an embodiment of the present disclosure, a pixel arrangement structure is provided comprising a plurality of repeatedly arranged groups of sub-pixels, each group of sub-pixels comprising: one first sub-pixel and two second sub-pixels sequentially arranged in an i-th column, i being a natural number; two third sub-pixels and one first sub-pixel sequentially arranged in an (i+1)-th column; two second sub-pixels and one first sub-pixel sequentially arranged in an (i+2)-th column; and one first sub-pixel and two third pixels sequentially arranged in an (i+3)-th column. At least a portion of each of the two second sub-pixels in the i-th column overlaps in a row direction with a respective portion of the first sub-pixel in the (i+1)-th column. At least a portion of each of the two third sub-pixels in the (i+1) column overlaps in the row direction with a respective portion of the first sub-pixel in the i-th column. At least a portion of each of the two second sub-pixels in the (i+2)-th column overlaps in the row direction with a respective portion of the first sub-pixel in the (i+3)-th column. At least a portion of each of the two third sub-pixels in the (i+3)-th column overlaps column in the row direction with a respective portion of the first sub-pixel in the (i+2)-th column.

In some embodiments, the first sub-pixels, the second sub-pixels, and the third sub-pixels are configured to emit light of different colors.

In some embodiments, each of the first sub-pixels, the second sub-pixels, and the third sub-pixels has a shape selected from a group consisting of a circle, an ellipse, and a polygon.

According to an embodiment of the present disclosure, a pixel arrangement structure is provided comprising a plurality of repeatedly arranged groups of sub-pixels, each group of sub-pixels comprising: a first sub-pixel, a second sub-pixel, and a third sub-pixel sequentially arranged in an i-th column, i being a natural number; a second sub-pixel, a third sub-pixel, and a first sub-pixel sequentially arranged in an (i+1)-th column; a second sub-pixel, a third sub-pixel, and a first sub-pixel sequentially arranged in an (i+2)-th column; and a first sub-pixel, a second sub-pixel, and a third sub-pixel sequentially arranged in an (i+3)-th column. At least a portion of each of the second sub-pixel and the third sub-pixel in the i-th column overlaps in a row direction with a respective portion of the first sub-pixel in the (i+1)-th column. At least a portion of each of the second sub-pixel and the third sub-pixel in the (i+1)-th column overlaps in the row direction with a respective portion of the first sub-pixel in the i-th column. At least a portion of each of the second sub-pixel and the third sub-pixel in the (i+2)-th column overlaps in the row direction with a respective portion of the first sub-pixel in the (i+3)-th column. At least a portion of each of the second sub-pixel and the third sub-pixel in the (i+3)-th column overlaps in the row direction with a respective portion of the first sub-pixel in the (i+2)-th column.

In some embodiments, the first sub-pixels, the second sub-pixels, and the third sub-pixels are configured to emit light of different colors.

In some embodiments, each of the first sub-pixels, the second sub-pixels, and the third sub-pixels has a shape selected from a group consisting of a circle, an ellipse, and a polygon.

According to an embodiment of the present disclosure, a display panel is provided comprising pixels arranged in accordance with the pixel arrangement structure as described above.

In some embodiments, the display panel is selected from a group consisting of an organic luminescent display panel and a liquid crystal display panel.

According to an embodiment of the present disclosure, a display device is provided comprising the display panel as described above.

According to an embodiment of the present disclosure, a set of masks for vapor-depositing an organic luminescent material in fabricating an organic luminescent display panel is provided. The organic luminescent display panel comprises pixels arranged in accordance with the pixel arrangement structure as recited above. The set of masks comprises: a first mask comprising a first metal frame defining a plurality of first openings, each of the first openings having a shape corresponding to a respective pair of directly adjacent ones of the first sub-pixels together with a region between the respective pair of first sub-pixels; a second mask comprising a second metal frame defining a plurality of second openings, each of the second openings having a shape corresponding to a respective pair of directly adjacent ones of the second sub-pixels together with a region between the respective pair of second sub-pixels; and a third mask comprising a third metal frame defining a plurality of third openings, each of the third openings having a shape corresponding to a respective pair of directly adjacent ones of the third sub-pixels together with a region between the respective pair of third sub-pixels. The first openings are arranged to have a same pattern as respective pairs of directly adjacent first sub-pixels in the pixel arrangement structure. The second openings are arranged to have a same pattern as respective pairs of directly adjacent second sub-pixels in the pixel arrangement structure. The third openings are arranged to have a same pattern as respective pairs of directly adjacent third sub-pixels in the pixel arrangement structure.

These and other embodiments of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another. Thus, a first element, component, region, layer, or section discussed below could be termed a second element, component, region, layer, or section without departing from the teachings of the present disclosure.

Spatially relative terms, such as "a column direction", "a row direction" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to", or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
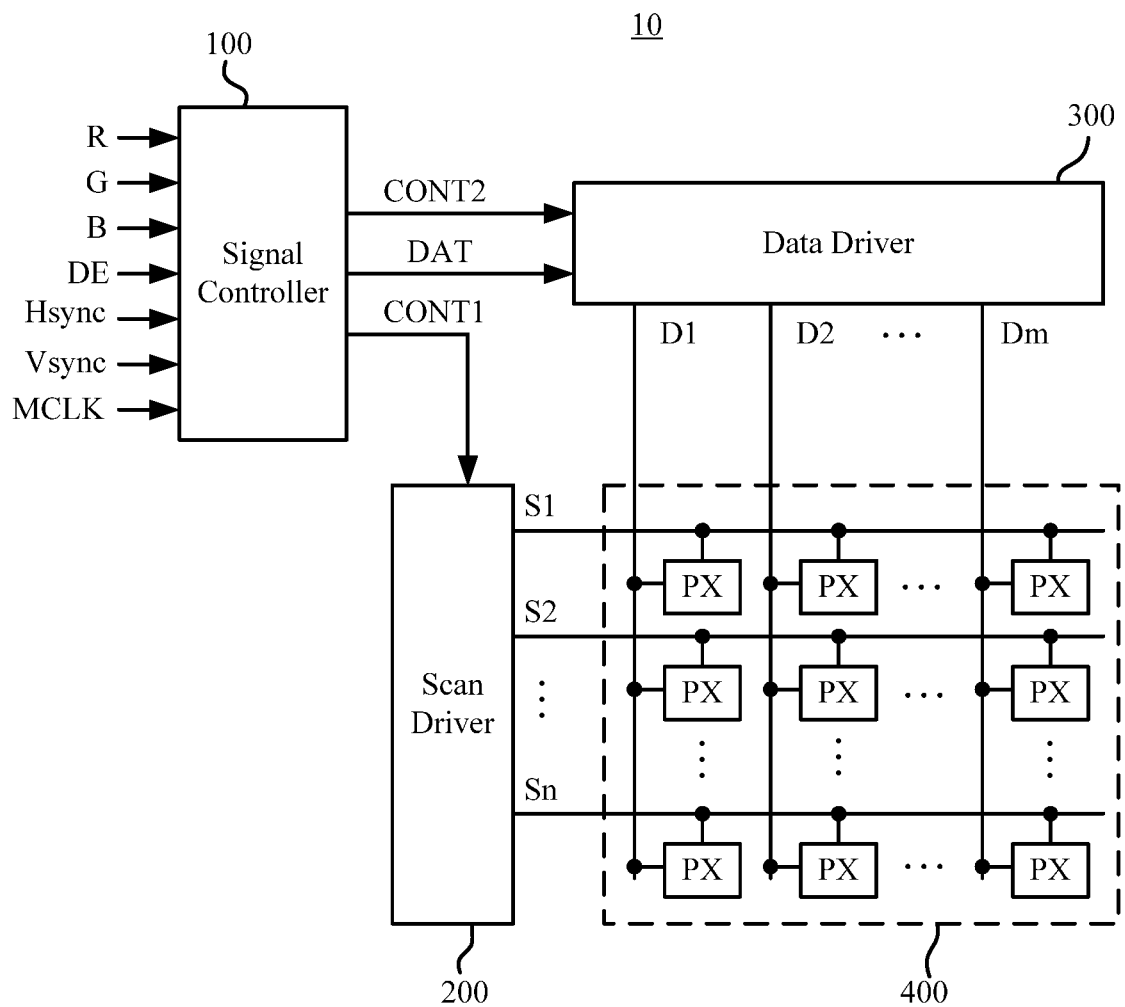
FIG. 1 schematically illustrates a block diagram of a display device in accordance with an embodiment of the present disclosure.

FIG. 1 schematically illustrates a block diagram of a display device 10 in accordance with an embodiment of the present disclosure. Referring to FIG. 1, the display device 10 includes a signal controller 100, a scan driver 200, a data driver 300, and a display panel 400.

The signal controller 100 receives a synchronization signal and video signals R, G, and B input from an external device. The video signals R, G, and B include luminance information of each of a plurality of pixels PX, wherein the luminance has a set number (for example, a predetermined number) of grayscales (or gradations), for example, 1024 ($=2^{10}$), 256 ($=2^8$), or 64 ($=2^6$) grayscales. The synchronization signal includes a horizontal synchronization signal Hsync, a vertical synchronization signal Vsync, a main clock signal MCLK, and a data enable signal DE.

The signal controller 100 generates a first driving control signal CONT1, a second driving control signal CONT2, and image data signal DAT based on the video signals R, G, and B, the horizontal synchronization signal Hsync, the vertical synchronization signal Vsync, the data enable signal DE, and the main clock signal MCLK. The signal controller 100 divides the video signals R, G, and B into units of frames according to the vertical synchronization signal Vsync, and the video signals R, G, and B into units of data lines according to the horizontal synchronization signal Hsync, to generate the image data signal DAT. The signal controller 100 transmits the image data signal DAT and the second drive control signal CONT2 to the data driver 300.

The display panel 400 includes the pixels PX that are substantially arranged in a matrix form. The arrangement of the pixels PX will be described in detail below with reference to FIGS. 2-5. In the display panel 400, a plurality of substantially parallel scan lines S1 to Sn extend in a row direction, and a plurality of substantially parallel data lines D1 to Dm extend in a column direction. The scan lines S1 to Sn and the data lines D1 to Dm are coupled to the pixels PX. In some embodiments, the display panel 400 can be an organic luminescent display panel. In a non-limiting example, the organic luminescent display panel may include a display substrate on which the organic luminescent pixel structure is formed and a cover plate facing the display substrate. In some embodiments, the display panel 400 can be a liquid crystal display panel. In a non-limiting example, the liquid crystal display panel may include a first substrate on which pixel electrodes are formed, a second substrate on which a color filter (CF) is formed, and a liquid crystal layer disposed between the first substrate and the second substrate. Color rendering can be achieved by means of the filtering effect of the color filter.

The scan driver 200 is coupled to the scan lines S1-Sn, and generates a corresponding plurality of scan signals S[1] to S[n] according to the first drive control signal CONT1. The scan driver 200 can sequentially apply the scan signal S[1]-S[n] having a gate-on voltage to the scan lines S1-Sn, respectively. The first driving control signal CONT1 includes a frame start signal FLM, a first clock signal SCLK1, and a second clock signal SCLK2. The frame start signal FLM may be a signal that generates the first scan signal S[1] for displaying a single-frame image. The first clock signal SCLK1 and the second clock signal SCLK2 are synchronization signals for sequentially generating the scan signals S[1]-S[n] and applying them to the corresponding scan lines S1-Sn.

The data driver 300 is coupled to the data lines D1-Dm, samples and holds the image data signal DAT according to the second driving control signal CONT2, and applies a plurality of data signals D[1] to D[m] to the data lines D1 to Dm, respectively. By applying the data signals D[1] to D[m] having a set voltage range (for example, a predetermined voltage range) to the data lines D1 to Dm according to the scan signals S[1] to S[n] having the gate-on voltage which are applied respectively to the scan lines S1 to Sn [m], the data driver 300 can program data to the pixels PX.

The display device 10 can be any product or component having a display function, such as a mobile phone, a tablet computer, a television, a display, a notebook computer, a digital photo frame, a navigator, and the like.

Figure 2:
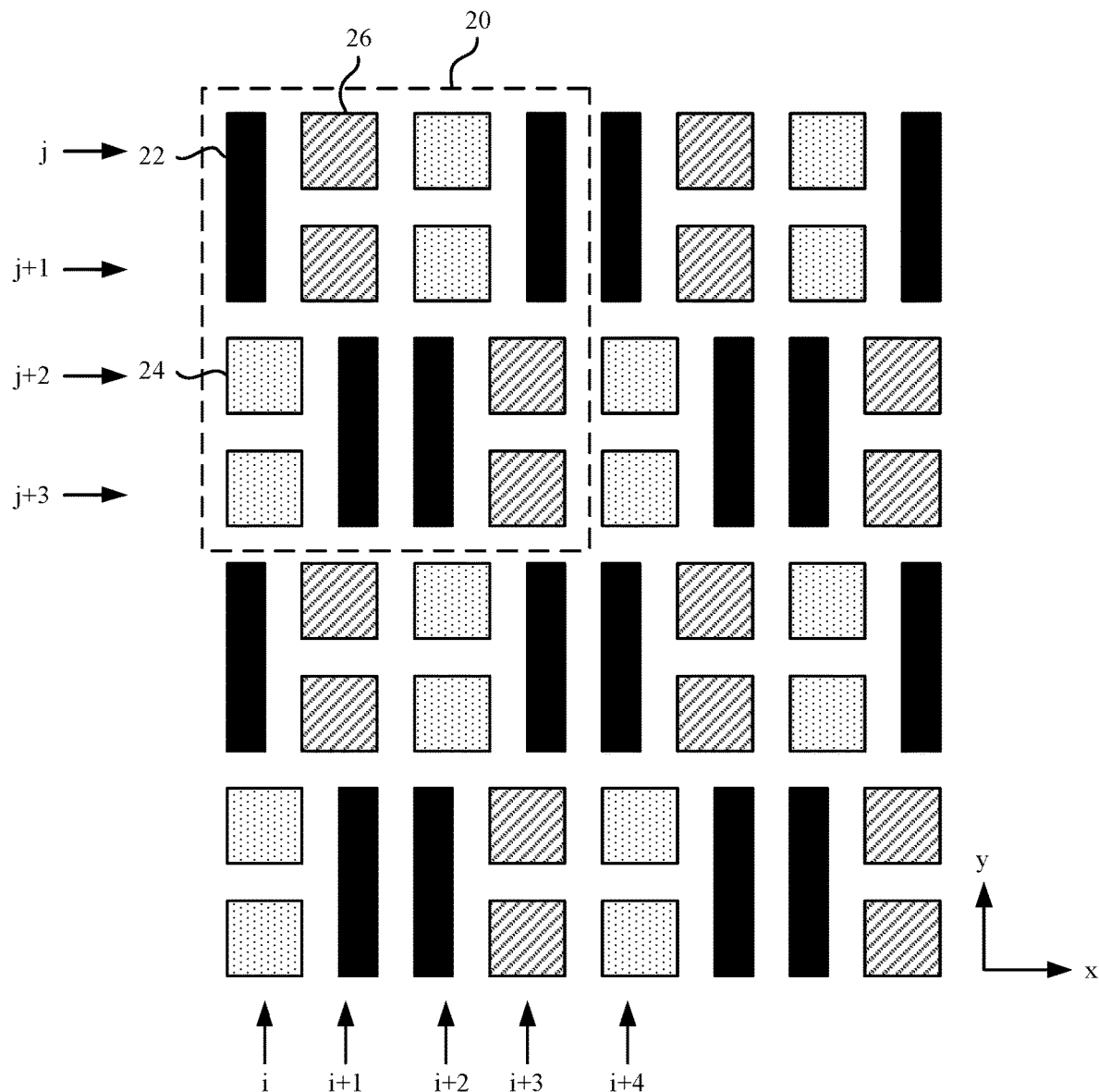
FIG. 2 schematically illustrates a plan view of a pixel arrangement structure according to an embodiment of the present disclosure.

FIG. 2 schematically illustrates a plan view of a pixel arrangement structure according to an embodiment of the present disclosure. Referring to FIG. 2, the pixel arrangement structure includes a plurality of repeatedly arranged groups of sub-pixels 20, each of which includes sub-pixels 22, 24, and 26.

The first sub-pixel 22 emits light of a first color, the second sub-pixel 24 emits light of a second color, and the second sub-pixel 26 emits light of a third color. As an example, the first color may be blue, the second color may be red, and the third color may be green. However, the present disclosure is not limited thereto. More generally, the first sub-pixel 22, the second sub-pixel 24, and the third sub-pixel 26 can be configured to emit light of different colors.

In this embodiment, each of the groups of sub-pixels 20 includes four first sub-pixels 22, four second sub-pixels 24, and four third sub-pixels 26 arranged in four rows and four columns. Specifically, as shown in FIG. 2, the group of sub-pixels 20 includes one first sub-pixel 22 and two second sub-pixels 24 sequentially arranged in an i-th column (in a negative direction of the y-axis) (here i is a natural number), two third sub-pixels 26 and one first sub-pixel 22 sequentially arranged in an (i+1) column, two second sub-pixels 24 and one first sub-pixel sequentially arranged in an (i+2)-th column 22, and one first sub-pixel 22 and two third pixels 26 sequentially arranged in an (i+3)-th column. More specifically, each of the two second sub-pixels 24 in the i-th column overlaps in a row direction (the direction of the x-axis in FIG. 2) with a respective portion of the first sub-pixel 22 in the (i+1) column, each of the two third sub-pixels 26 in the (i+1)-th column overlaps in the row direction with a respective portion of the first sub-pixel 22 in the i-th column, each of the two sub-pixels 24 in the (i+2)-th column overlaps in the row direction with a respective portion of the first sub-pixel 22 in the (i+3)-th column, and each of the two third sub-pixels 26 in the (i+3)-th column overlap in the row direction with a respective portion of the first sub-pixel 22 in the (i+2)-th column. In other words, each of the first sub-pixels 22 is arranged to be distributed across two adjacent rows. For example, as illustrated, the first sub-pixels 22 in the i-th column and the (i+3)-th column are distributed across a j-th row and a (j+1)-th row (here j is a natural number) such that they overlap with the second sub-pixels 24 and the third sub-pixels 26 in the j-th row and the (j+1)-th row, and the first sub-pixels 22 in the (i+1) column and the (i+2)-th column are distributed across a (j+2)-th row and a (j+3)-th row such that they overlap with the second sub-pixels 24 and the third sub-pixels 26 in the (j+2)-th row and the (j+3)-th row.

By means of the pixel arrangement described above, it is possible to obtain a high pixel resolution since a relatively large number of sub-pixels are provided in comparison to a scheme in which every two directly adjacent sub-pixels of the same color are otherwise merged into one single sub-pixel, for example. With the relatively large number of sub-pixels, "pixel borrowing" can also be realized more easily, thereby facilitating sub-pixel rendering.

It will be understood that the pixel arrangement shown in FIG. 2 is exemplary, as the properties of the sub-pixels 22, 24, and 26, including their relative size and shape, may vary in other embodiments.

Figure 3:
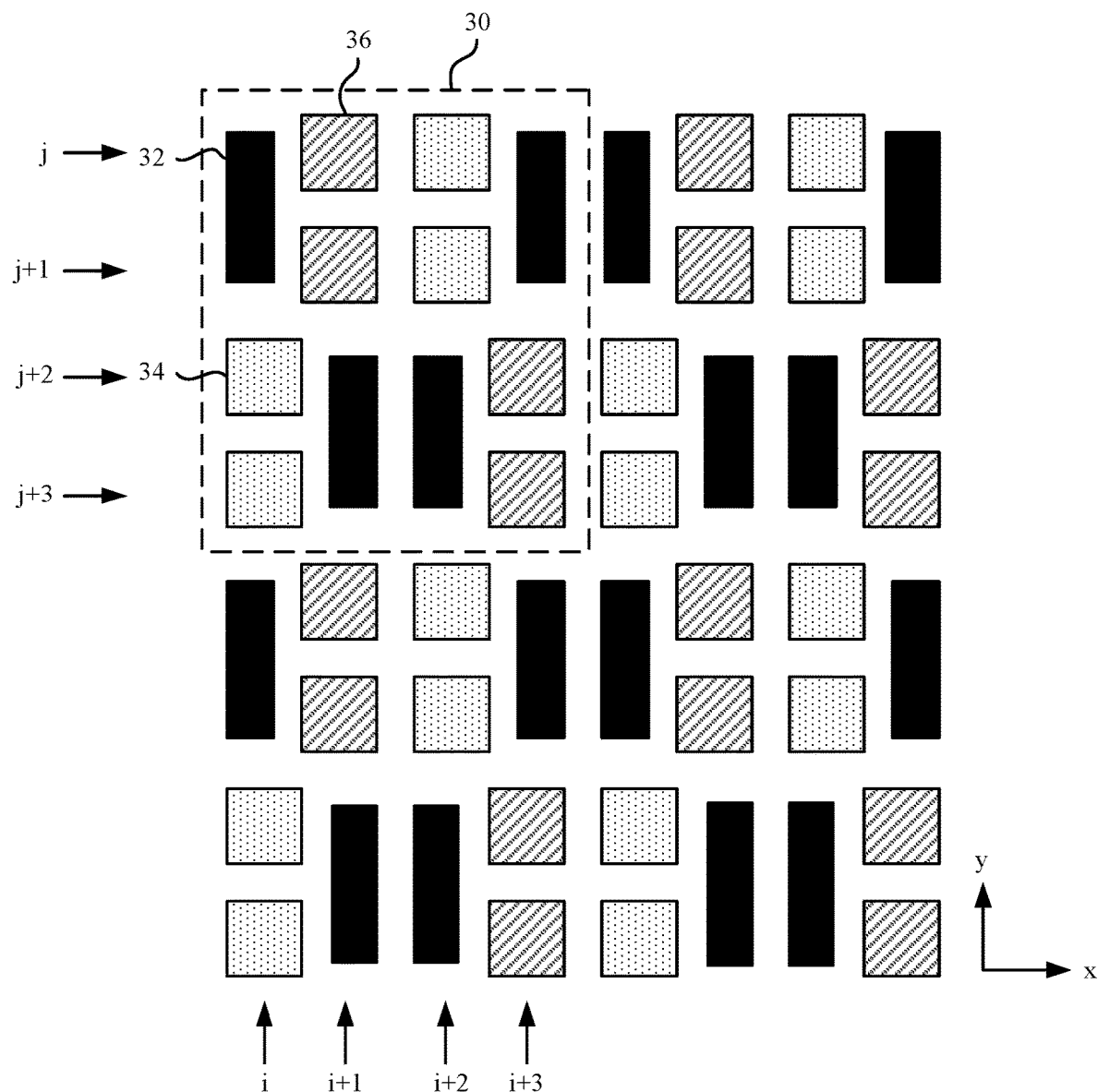
FIG. 3 is a plan view schematically illustrating a variation of the pixel arrangement structure of FIG. 2.

FIG. 3 schematically illustrates a plan view of a variation of the pixel arrangement structure of FIG. 2. Referring to FIG. 3, the pixel arrangement structure includes a plurality of repeatedly arranged groups of sub-pixels 30, each of which includes sub-pixels 32, 34, and 36.

Similar to the embodiment described above with respect to FIG. 2, each of the groups of sub-pixels 30 includes four first sub-pixels 32, four second sub-pixels 34, and four third sub-pixels 36 arranged in four rows and four columns.

This embodiment differs from the embodiment of FIG. 2 in that the first sub-pixel 32 now has a larger width and a smaller length than the first sub-pixel 22. In this case, as shown in FIG. 3, only a portion of each of the two second sub-pixels 34 in the i-th column overlaps in the row direction with a respective portion of the first sub-pixel 32 in the (i+1)-th column, only a portion of each of the two third sub-pixels 36 in the (i+1)-th column overlaps in the row direction with a respective portion of the first sub-pixel 32 in the i-th column, only a portion of each of the second sub-pixels 34 in the (i+2)-th column overlaps in the row direction with a respective portion of the first sub-pixel 32 in the (i+3)-th column, and only a portion of each of the two third sub-pixels 36 in the (i+3)-th column overlaps in the row direction with a respective portion of the first sub-pixel 32 in the (i+2)-th column. The embodiment of FIG. 3 is exemplary; other embodiments are also contemplated.

Figure 4:
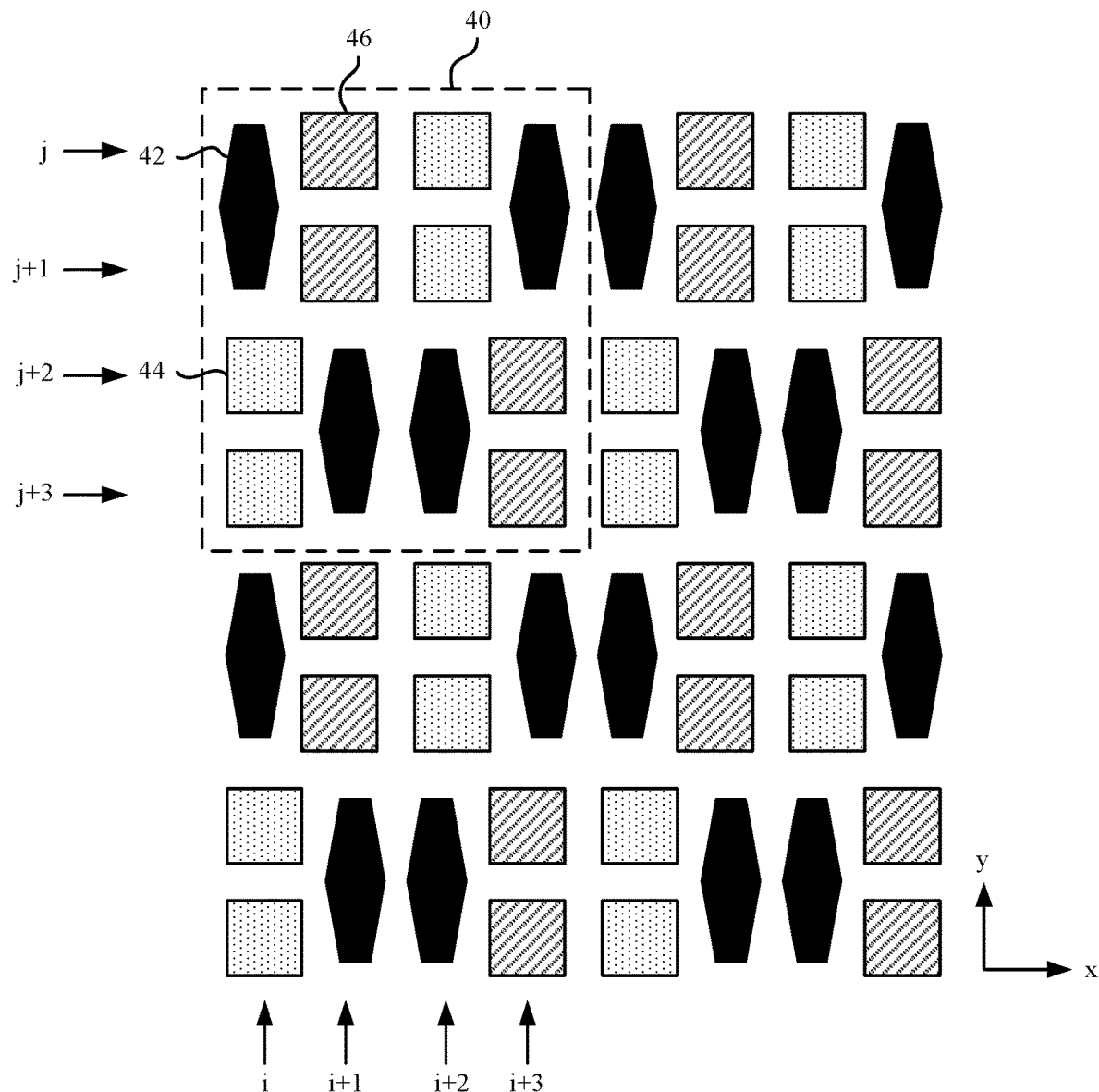
FIG. 4 is a plan view schematically illustrating a variation of the pixel arrangement structure of FIG. 2.

FIG. 4 schematically illustrates a plan view of a variation of the pixel arrangement structure of FIG. 2. Referring to FIG. 4, the pixel arrangement structure includes a plurality of repeatedly arranged groups of sub-pixels 40, each of which includes sub-pixels 42, 44, and 46.

Similar to the embodiment described above with respect to FIG. 2, each of the groups of sub-pixels 40 includes four first sub-pixels 42, four second sub-pixels 44, and four third sub-pixels 46 arranged in four rows and four columns.

This embodiment differs from the embodiment of FIG. 2 in that the first sub-pixel 42 now has a shape of a hexagon. In this case, as shown in FIG. 4, only a portion of each of the two second sub-pixels 44 in the i-th column overlaps in the row direction with a respective portion of the first sub-pixel 42 in the (i+1)-th column, only a portion of each of the two third sub-pixels 46 in the (i+1)-th column overlaps in the row direction with a respective portion of the first sub-pixel 42 in the i-th column, only a portion of each of the two second sub-pixels 44 in the (i+2)-th column overlaps in the row direction with a respective portion of the first sub-pixel 42 in the (i+3)-th column, and only a portion of each of the two third sub-pixels 46 in the (i+3)-th column overlaps in the row direction with a respective portion of the first sub-pixel 42 in the (i+2)-th column. The embodiment of FIG. 4 is exemplary; other embodiments are also contemplated. For example, each of the first sub-pixel 42, the second sub-pixel 44, and the third sub-pixel 46 may have other polygonal shapes (e.g., triangular, quadrangular, or pentagonal shapes), circular shapes, elliptical shapes, or other shapes.

Figure 5:
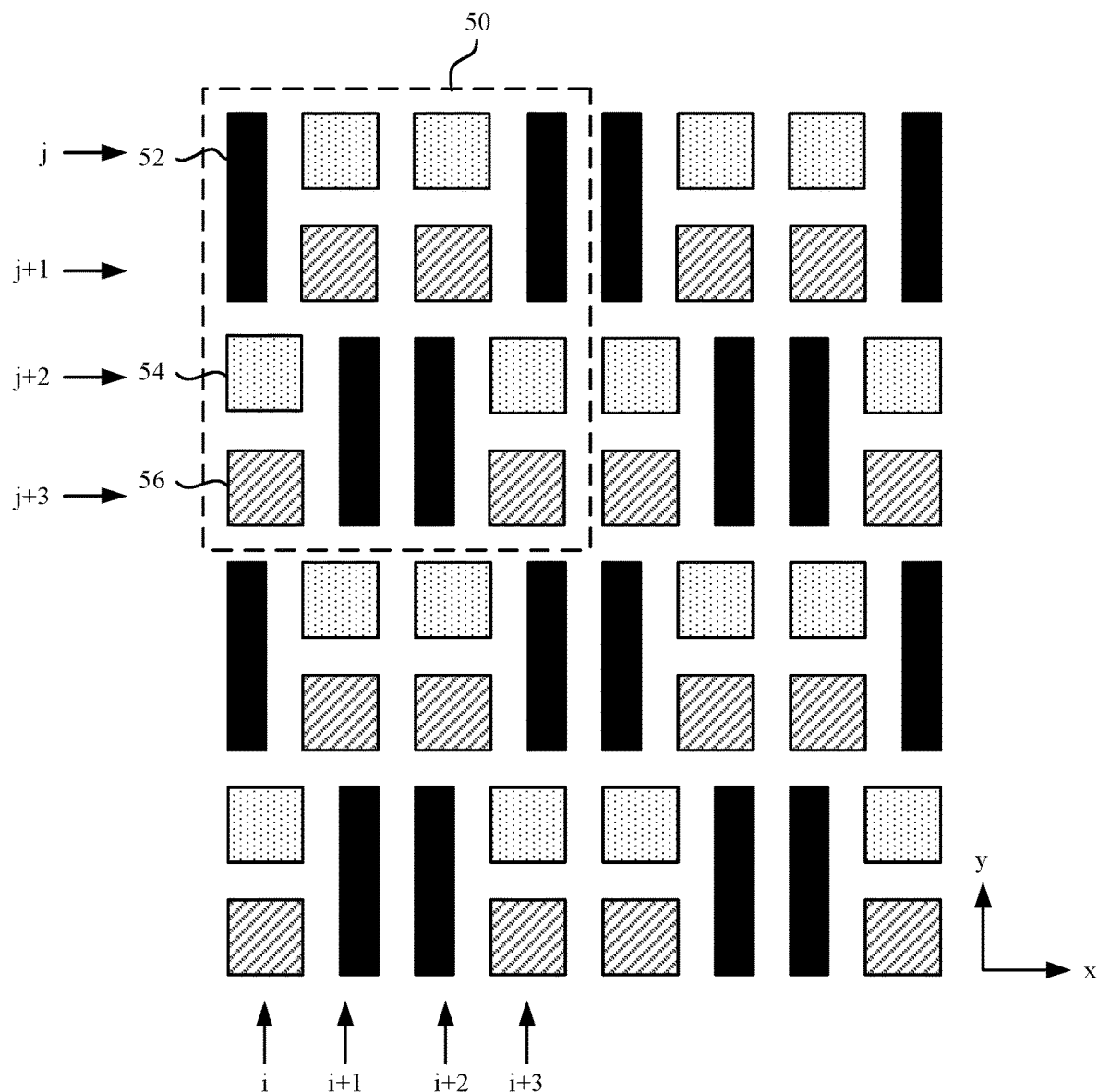
FIG. 5 schematically illustrates a plan view of a pixel arrangement structure according to another embodiment of the present disclosure.

FIG. 5 schematically illustrates a plan view of a pixel arrangement structure according to another embodiment of the present disclosure. Referring to FIG. 5, the pixel arrangement structure includes a plurality of repeatedly arranged groups of sub-pixels 50, each of the groups of sub-pixels including sub-pixels 52, 54, and 56, wherein the first sub-pixel 52, the second sub-pixel 54, and the third sub-pixel 56 can be configured to emit light of different colors.

In this embodiment, each of the groups of sub-pixels 50 includes four first sub-pixels 52, four second sub-pixels 54, and four third sub-pixels 56 arranged in four rows and four columns. Specifically, as shown in FIG. 5, the group of sub-pixels 50 includes a first sub-pixel 52, a second sub-pixel 54 and a third sub-pixel 56 sequentially arranged in an i-th column (here i is a natural number), a second sub-pixel 54, a third sub-pixel 56 and a first sub-pixel 52 sequentially arranged in an (i+1)-th column, a second sub-pixel 54, a third sub-pixel 56 and a first sub-pixel 52 sequentially arranged in an (i+2)-th column, and a first sub-pixel 52, a second sub-pixel 54 and a third sub-pixel 56 sequentially arranged in an (i+3)-th column. More specifically, each of the second sub-pixel 54 and the third sub-pixel 56 in the i-th column overlaps in a row direction with a respective portion of the first sub-pixel 52 in the (i+1) column, each of the second sub-pixel 54 and the third sub-pixel 56 in the (i+1)-th column overlaps in the row direction with a respective portion of the first sub-pixel 52 in the i-th column, each of the second sub-pixel 54 and the third sub-pixels 56 in the (i+2)-th column overlaps in the row direction with a respective portion of the first sub-pixel 52 in the (i+3)-th column, and each of the the second sub-pixel 54 and the third sub-pixel 56 in the (i+3)-th column overlaps in the row direction with a respective portion of the first sub-pixel 52 in the (i+2)-th column. In other words, each of the first sub-pixels 52 is arranged to be distributed across two adjacent rows. For example, as illustrated, the first sub-pixels 52 in the i-th column and the (i+3)-th column are distributed across a j-th row and a (j+1)-th row (here j is a natural number) such that they overlaps with the second sub-pixels 54 in the j-th row and the third sub-pixels 56 in the (j+1)-th row, and the first sub-pixels 52 in the (i+1)-th column and the (i+2)-th column are distributed across a (j+2)-th row and a (j+3)-th row such that they overlap with the second sub-pixels 54 in the (j+2)-th row and the third sub-pixels 56 in the (j+3)-th row.

Similar to the embodiment described above in connection with FIG. 2, the pixel arrangement shown in FIG. 5 may allow for a high pixel resolution because a relatively number of sub-pixels are provided in comparison to, for example, a scheme in which every two directly adjacent sub-pixels of the same color are otherwise merged into one single sub-pixel.

It will be understood that the pixel arrangement shown in FIG. 5 is exemplary, as the properties of the sub-pixel 52, 54, and 56, including their relative size and shape, may vary in other embodiments. For example, similar to the embodiment described above in connection with FIG. 3, the sub-pixels 52, 54, and 56 may have different relative dimensions than illustrated. For another example, similar to the embodiment described above in connection with FIG. 4, the sub-pixels 52, 54, and 56 may have shapes other than those illustrated, such as, for example, a polygonal, circular, or elliptical shape.

The pixel arrangement structures described in the above embodiments can be applied to an organic luminescent display panel or a liquid crystal display panel. In the case of an organic luminescent display panel, the pixel arrangement structure can be formed by vapor-depositing an organic luminescent material on a substrate using a set of masks (for example, FMM). The quality of the organic luminescent display panel (e.g., pixel resolution) is largely constrained by the precision of the masks because the masks typically have a low precision due to the process (e.g., etching) by which they are manufactured.

Figure 6A:
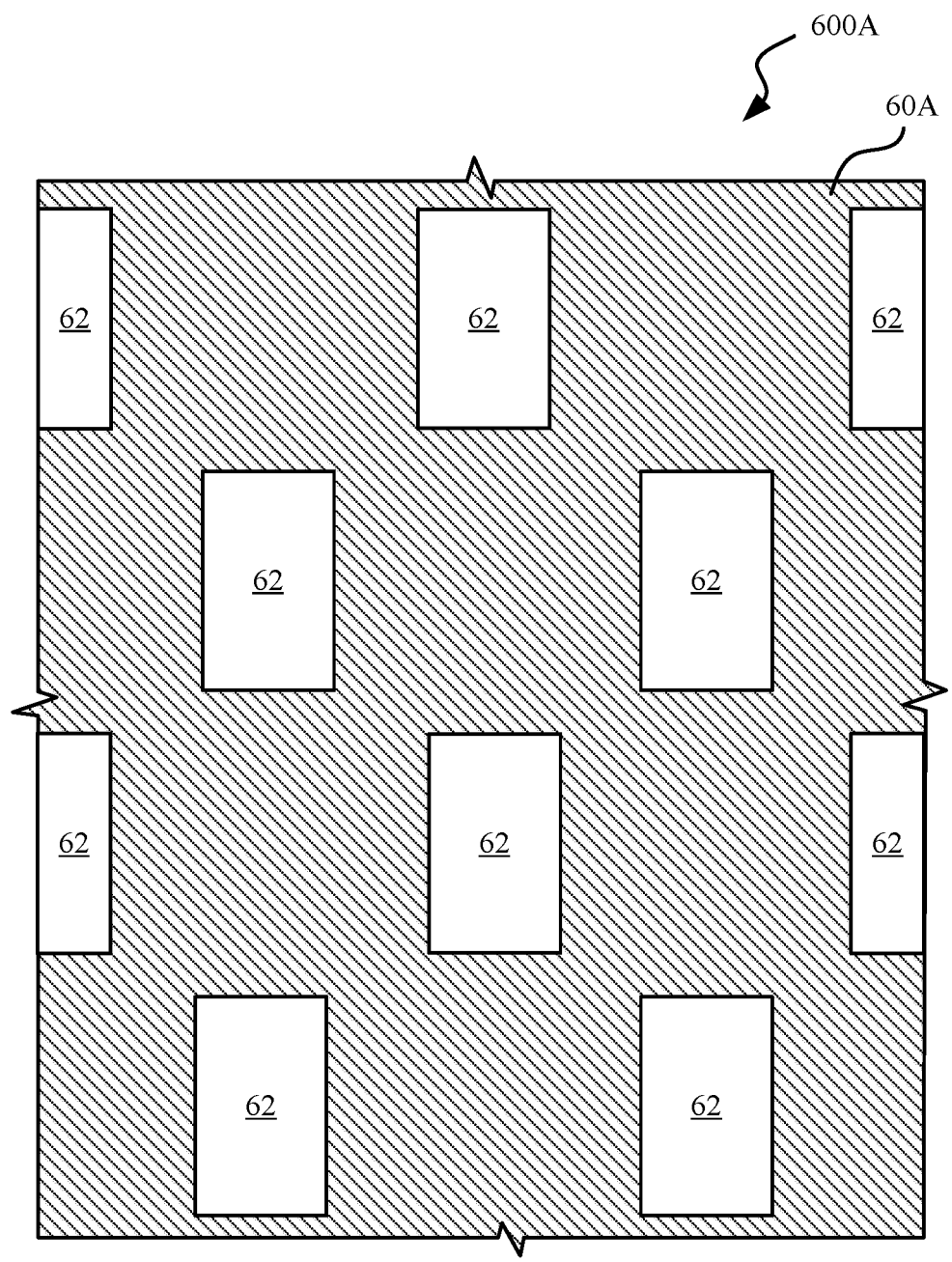
FIG. 6A schematically illustrate a plan view of a set of masks in accordance with an embodiment of the present disclosure.
Figure 6B:
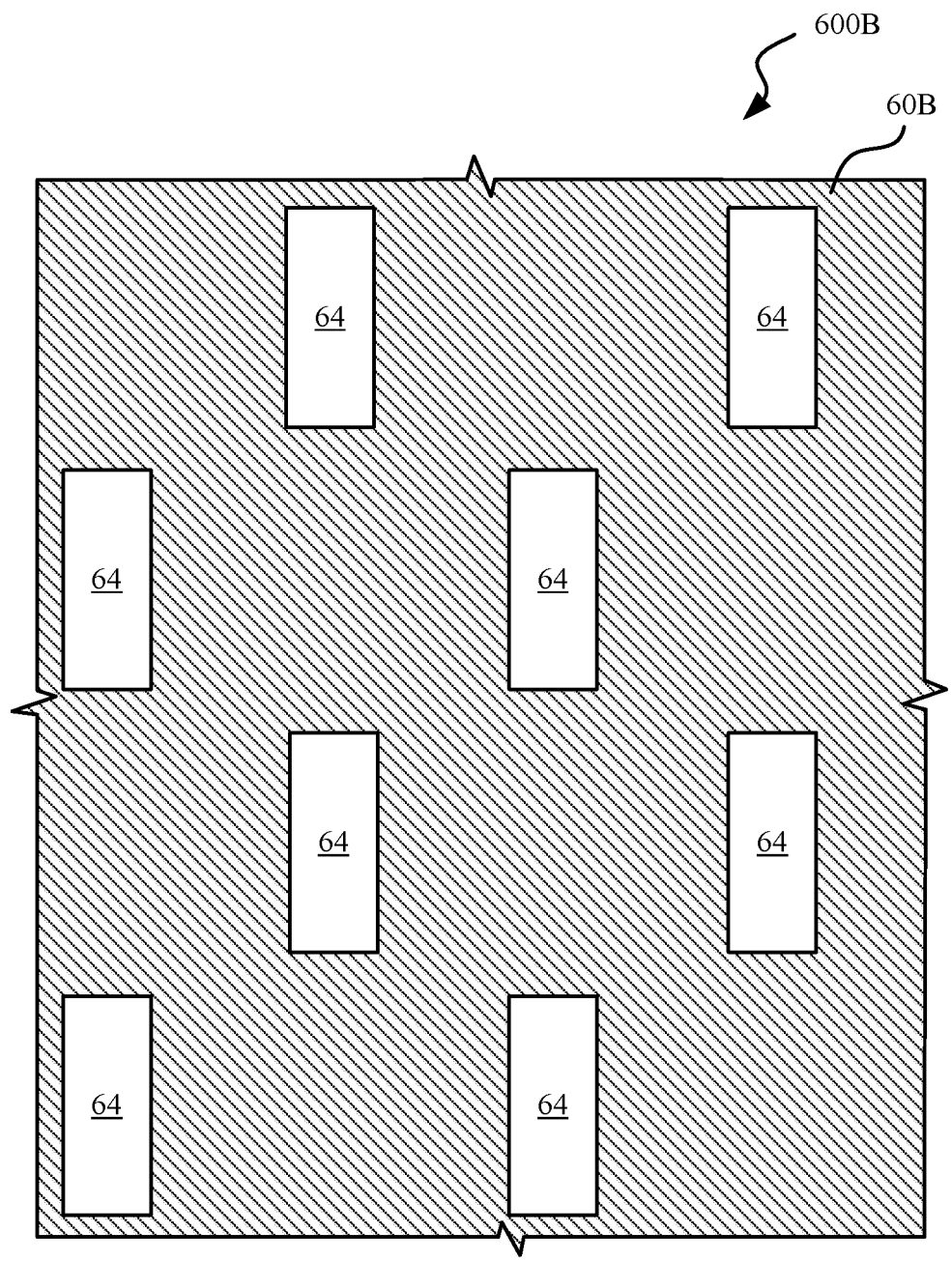
FIG. 6B schematically illustrate a plan view of a set of masks in accordance with an embodiment of the present disclosure.
Figure 6C:
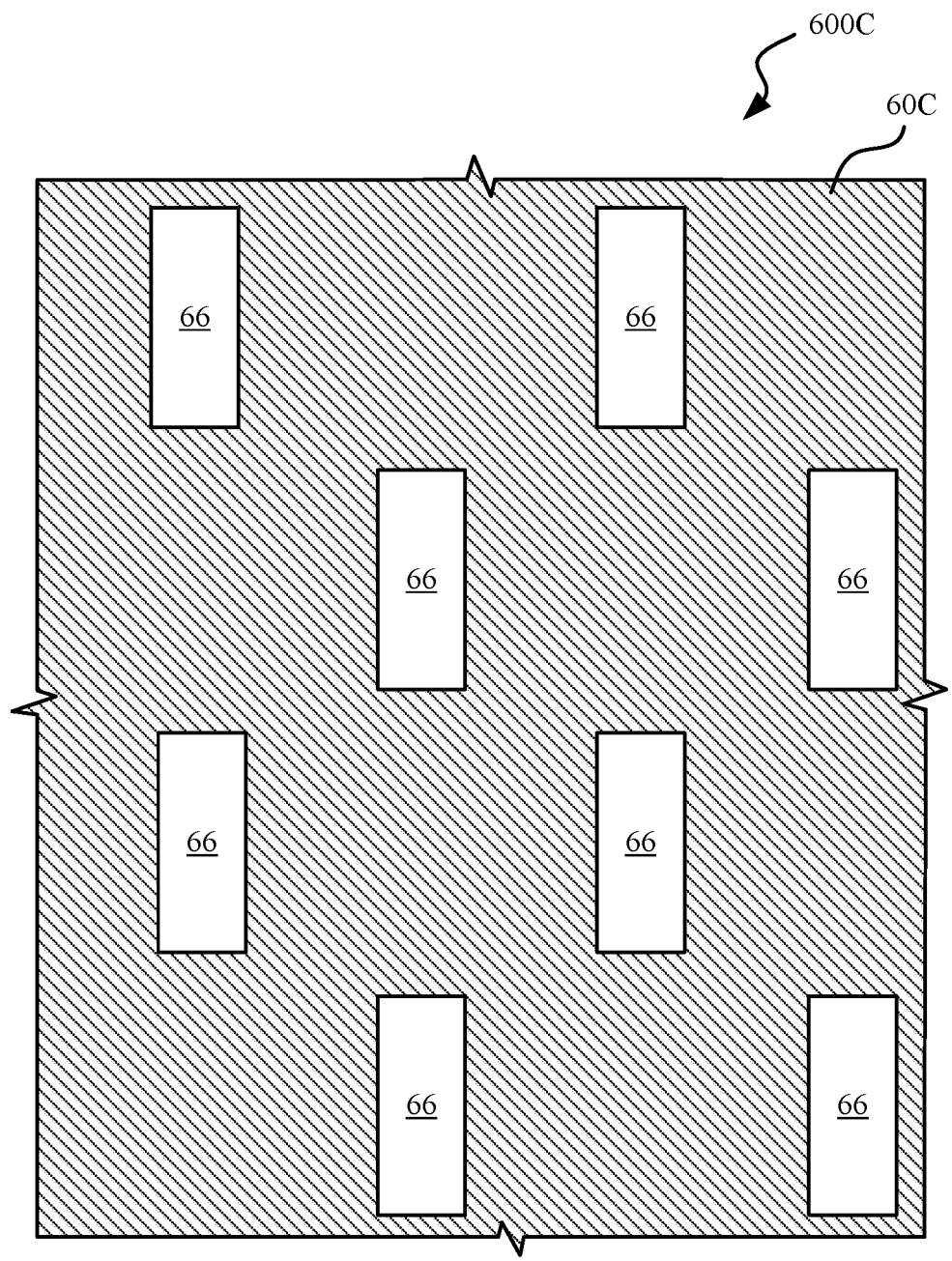
FIG. 6C schematically illustrate a plan view of a set of masks in accordance with an embodiment of the present disclosure.

FIGS. 6A-6C schematically illustrate plan views of a set of masks according to an embodiment of the present disclosure.

Referring to FIGS. 6A-6C, the set of masks includes a first mask 600A including a first metal frame 60A defining a plurality of first openings 62, a second mask 600B including a second metal frame 60B defining a plurality of second openings 64, and a third mask 600C including a third metal frame 60C defining a plurality of third openings 66. It will be understood that as indicated by the "Z" shaped section lines in FIGS. 6A-6C the metal frames 60A, 60B, and 60C as shown are only a part of them, and that the first, second and third openings 62, 64, 66 may be repeatedly arranged in a constant pattern.

In this embodiment, the set of masks can be used to form the pixel arrangement structure as shown in FIG. 2. In the first mask 600A, each of the first openings 62 has a shape corresponding to a respective pair of directly adjacent ones of the first sub-pixels 22 in the pixel arrangement structure together with a region between this respective pair of first sub-pixels 22. For example, the uppermost and middle first opening 62 in FIG. 6A has a shape corresponding to the two first sub-pixels 22 in FIG. 2 that are located in the (i+3)-th column and the (i+4)-th column and are distributed across the j-th row and the (j+1)-th row together with the region between these two sub-pixels 22. Moreover, in the first mask 600A, the first openings 62 are arranged to have the same pattern as respective pairs of directly adjacent first sub-pixels 22 in the pixel arrangement structure. In forming the first sub-pixels 22, the first mask 600A is positioned such that the first openings 62 are respectively aligned with respective anode regions on the substrate for the respective pairs of directly adjacent first sub-pixels (each anode region including two anodes separated from each other, with each anode corresponding to a first sub-pixel), and the evaporated organic luminescent material passes through the first openings 62 and reaches the anode regions on the substrate, thereby forming individual first sub-pixels 22.

In the second mask 600B, each of the second openings 64 has a shape corresponding to a respective pair of directly adjacent ones of the second sub-pixels 24 in the pixel arrangement structure together with a region between this respective pair of second sub-pixels 24, and the second openings 64 are arranged to have the same pattern as respective pairs of directly adjacent second sub-pixels 24 in the pixel arrangement. In forming the second sub-pixels 24, the second mask 600B is positioned such that the second openings 64 are respectively aligned with respective anode regions on the substrate for the respective pairs of directly adjacent second sub-pixels (each anode region including two anodes separated from each other, with each anode corresponding to a second sub-pixel), and the evaporated organic luminescent material passes through the second openings 64 and reaches the anode regions on the substrate, thereby forming individual second sub-pixels 24.

In the third mask 600C, each of the third openings 66 has a shape corresponding to a respective pair of directly adjacent ones of the third sub-pixels 26 in the pixel arrangement structure together with a region between this respective pair of third sub-pixels 26, and the third openings 66 are arranged to have the same pattern as respective pairs of directly adjacent third sub-pixels 26 in the pixel arrangement. In forming the third sub-pixels 26, the third mask 600C is positioned such that the third openings 66 are respectively aligned with respective anode regions on the substrate for the respective pairs of directly adjacent third sub-pixels (each anode region including two anodes separated from each other, with each anode corresponding to a third sub-pixel), and the evaporated organic luminescent material passes through the third openings 66 and reaches the anode regions on the substrate, thereby forming individual third sub-pixels 26.

By means of such masks, each of the openings can be used to form two (directly adjacent) sub-pixels. This allows for an increased pitch between the openings as compared to, for example, a mask design in which each opening is used to form only one sub-pixel. In other words, this allows a display panel having a higher pixel resolution to be fabricated with a mask of a lower precision, thereby facilitating a reduction in the fabrication cost of the mask while achieving a high pixel resolution.

It will be understood that the set of masks shown in FIGS. 6A-6C is exemplary and that other masks can be designed according to a desired pixel arrangement.

Figure 7A:
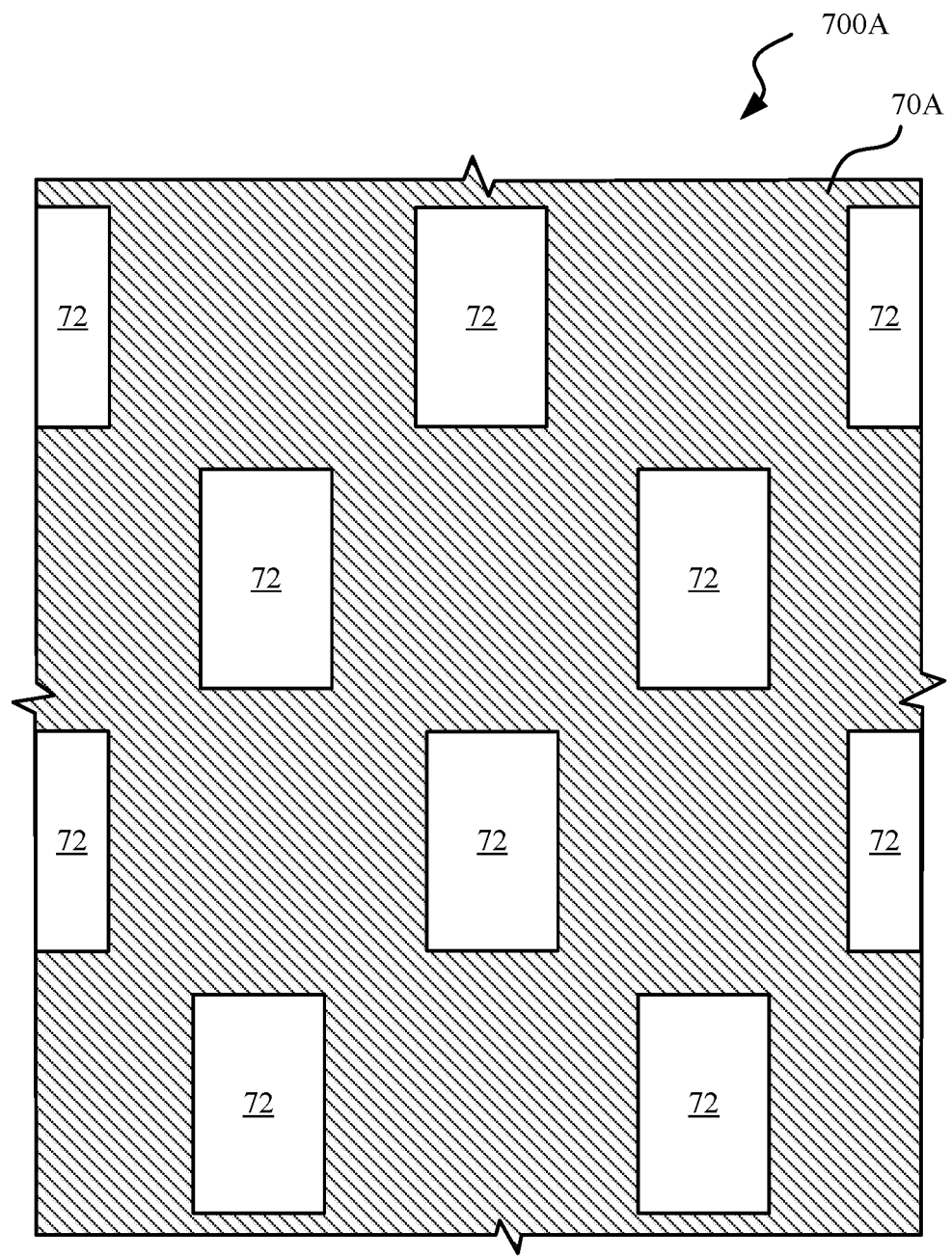
FIG. 7A schematically illustrate a plan view of a variation of the set of masks of FIGS. 6A-6C.
Figure 7B:
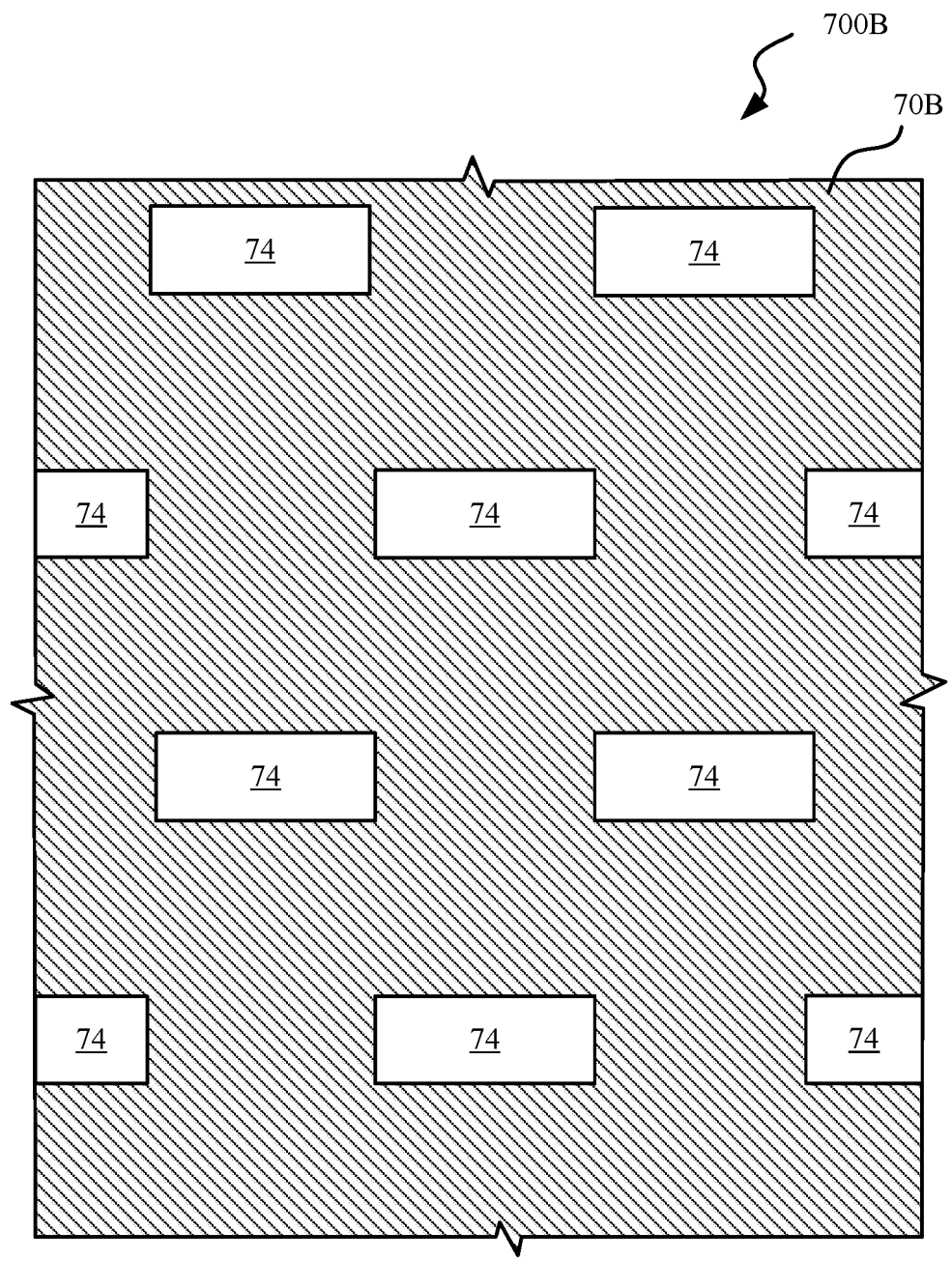
FIG. 7B schematically illustrate a plan view of a variation of the set of masks of FIGS. 6A-6C.
Figure 7C:
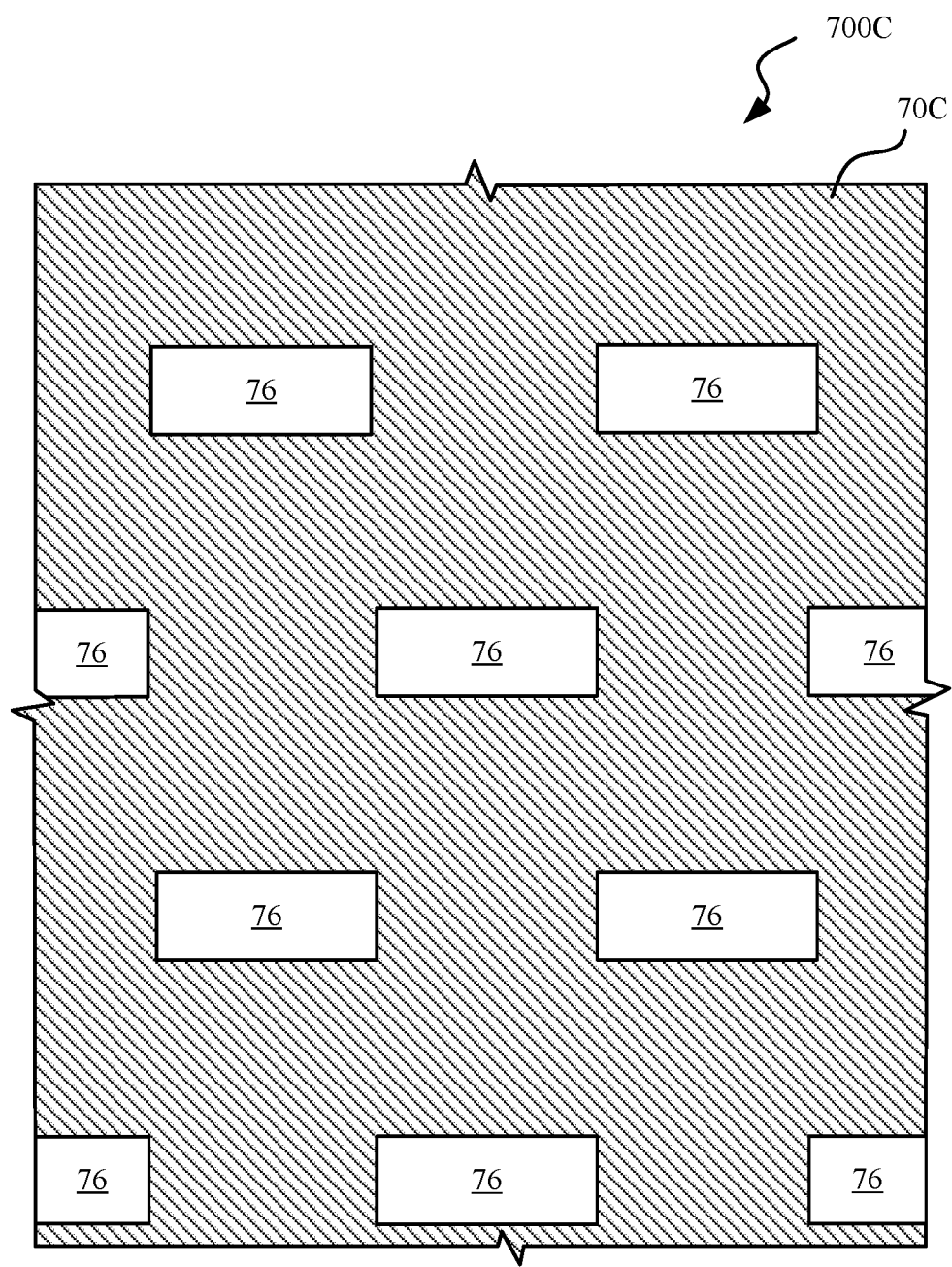
FIG. 7C schematically illustrate a plan view of a variation of the set of masks of FIGS. 6A-6C.

FIGS. 7A-7C schematically illustrate plan views of a variation of the set of masks of FIGS. 6A-6C.

Referring to FIGS. 7A-7C, the set of masks includes a first mask 700A including a first metal frame 70A defining a plurality of first openings 72, and a second mask 700B including a second metal frame 70B defining a plurality of second openings 74, and a third mask 700C including a third metal frame 70C defining a plurality of third openings 76.

In this embodiment, the set of masks can be used to form the pixel arrangement structure as shown in FIG. 5. In the first mask 700A, each of the first openings 72 has a shape corresponding to a respective pair of directly adjacent ones of the first sub-pixels 52 in the pixel arrangement structure together with a region between this respective pair of first sub-pixels 52, and the first openings 72 are arranged to have the same pattern as respective pairs of directly adjacent first sub-pixels 52 in the pixel arrangement.

In the second mask 700B, each of the second openings 74 has a shape corresponding to a respective pair of directly adjacent ones of the second sub-pixels 54 in the pixel arrangement structure together with a region between this respective pair of second sub-pixels 54, and the second openings 74 are arranged to have the same pattern as respective pairs of directly adjacent second sub-pixels 54 in the pixel arrangement.

In the third mask 700C, each of the third openings 76 has a shape corresponding to a respective pair of directly adjacent ones of the third sub-pixels 56 in the pixel arrangement structure together with a region between this respective pair of third sub-pixels 56, and the third openings 76 are arranged to have the same pattern as respective pairs of directly adjacent third sub-pixels 56 in the pixel arrangement.

It will be understood that the set of masks shown in FIGS. 7A-7C is exemplary and that other masks can be designed in accordance with a desired pixel arrangement structure.

While several specific implementation details are contained in the above discussions, these should not be construed as limitations on the scope of any disclosure or of what may be claimed, but rather as descriptions of features that may be specific to particular embodiments of particular disclosures. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A pixel arrangement structure comprising:
   a plurality of repeatedly arranged groups of sub-pixels, each group of sub-pixels comprising:
   one first sub-pixel and two second sub-pixels sequentially arranged in an i-th column, i being a natural number;
   two third sub-pixels and one first sub-pixel sequentially arranged in an (i+1)-th column;
   two second sub-pixels and one first sub-pixel sequentially arranged in an (i+2)-th column; and
   one first sub-pixel and two third sub-pixels sequentially arranged in an (i+3)-th column,
   wherein at least a portion of each of the two second sub-pixels in the i-th column overlaps in a row direction only with a respective portion of the first sub-pixel in the (i+1)-th column,
   wherein at least a portion of each of the two third sub-pixels in the (i+1) column overlaps in the row direction only with a respective portion of the first sub-pixel in the i-th column,
   wherein at least a portion of each of the two second sub-pixels in the (i+2)-th column overlaps in the row direction only with a respective portion of the first sub-pixel in the (i+3)-th column,
   wherein at least a portion of each of the two third sub-pixels in the (i+3)-th column overlaps column in the row direction only with a respective portion of the first sub-pixel in the (i+2)-th column, and wherein, in each group of sub-pixels, the (i+1)-th column is directly adjacent to the i-th column and the (i+2)-th column, and the (i+2)-th column is also directly adjacent to the (i+3)-th column.

2. The pixel arrangement structure of claim 1, further comprising a first sub-pixel set, a second sub-pixel set, and a third sub sub-pixel set,
wherein the first sub-pixel set comprises: the one first sub-pixel arranged in the i-th column, the one first sub-pixel arranged in the (i+1)-th column, the one first sub-pixel arranged in the (i+2)-th column, and the one first sub-pixel arranged in the (i+3)-th column,
wherein the second sub-pixel set comprises: the two second sub-pixels arranged in the i-th column, and the two second sub-pixels arranged in the (i+2)-th column,
wherein the third sub-pixel set comprises: the two third sub-pixels arranged in the (i+1)-th column, and the two third sub-pixels arranged in the (i+3)-th column, and
wherein the first sub-pixel set, the second sub-pixel set, and the third-sub-pixel set are configured to emit light of different colors.

3. The pixel arrangement structure of claim 2, wherein each of first sub-pixels in the first sub-pixel set, second sub-pixels in the second sub-pixel set, and third sub-pixels in the third sub-pixel set has a shape selected from a group consisting of a circle, an ellipse, and a polygon.

4. The pixel arrangement structure of claim 1, further comprising a first sub-pixel set, a second sub-pixel set, and a third sub-pixel set,
wherein the first sub-pixel set comprises: the one first sub-pixel arranged in the i-th column, the one first sub-pixel arranged in the (i+1)-th column, the one first sub-pixel arranged in the (i+2)-th column, and the one first sub-pixel arranged in the (i+3)-th column,
wherein the second sub-pixel set comprises: the two second sub-pixels arranged in the i-th column, and the two second sub-pixels arranged in the (i+2)-th column,
wherein the third sub-pixel set comprises: the two third sub-pixels arranged in the (i+1)-th column, and the two third sub-pixels arranged in the (i+3)-th column, and
wherein each of first sub-pixels in the first sub-pixel set, second sub-pixels in the second sub-pixel set, and third sub-pixels in the third sub-pixel set has a shape selected from a group consisting of a circle, an ellipse, and a polygon.

5. A pixel arrangement structure comprising:
a plurality of repeatedly arranged groups of sub-pixels, each group of sub-pixels comprising:
a first sub-pixel, a second sub-pixel, and a third sub-pixel sequentially arranged in an i-th column, i being a natural number;
a second sub-pixel, a third sub-pixel, and a first sub-pixel sequentially arranged in an (i+1)-th column;
a second sub-pixel, a third sub-pixel, and a first sub-pixel sequentially arranged in an (i+2)-th column; and
a first sub-pixel, a second sub-pixel, and a third sub-pixel sequentially arranged in an (i+3)-th column,
wherein at least a portion of each of the second sub-pixel and the third sub-pixel in the i-th column overlaps in a row direction only with a respective portion of the first sub-pixel in the (i+1)-th column,
wherein at least a portion of each of the second sub-pixel and the third sub-pixel in the (i+1)-th column overlaps in the row direction only with a respective portion of the first sub-pixel in the i-th column,
wherein at least a portion of each of the second sub-pixel and the third sub-pixel in the (i+2)-th column overlaps in the row direction only with a respective portion of the first sub-pixel in the (i+3)-th column,
wherein at least a portion of each of the second sub-pixel and the third sub-pixel in the (i+3)-th column overlaps in the row direction only with a respective portion of the first sub-pixel in the (i+2)-th column, and
wherein, in each group of sub-pixels, the (i+1)-th column is directly adjacent to the i-th column and the (i+2)-th column, and the (i+2)-th column is also directly adjacent to the (i+3)-th column.

6. The pixel arrangement structure of claim 5, further comprising a first sub-pixel set, a second sub-pixel set, and a third sub-pixel set,
wherein the first sub-pixel set comprises: the first sub-pixel arranged in the i-th column, the first sub-pixel arranged in the (i+1)-th column, the first sub-pixel arranged in the (i+2)-th column, and the first sub-pixel arranged in the (i+3)-th column,
wherein the second sub-pixel set comprises: the second sub-pixel arranged in the i-th column, the second sub-pixel arranged in the (i+1)-th column, the second sub-pixel arranged in the (i+2)-th column, and the second sub-pixel arranged in the (i+3)-th column,
wherein the third sub-pixel set comprises: the third sub-pixel arranged in the i-th column, the third sub-pixel arranged in the (i+1)-th column, the third sub-pixel arranged in the (i+2)-th column, and the third sub-pixel arranged in the (i+3)-th column, and
wherein the first sub-pixel set, the second sub-pixel set, and the third sub-pixel set are configured to emit light of different colors.

7. The pixel arrangement structure of claim 6, wherein each of first sub-pixels in the first sub-pixel set, second sub-pixels in the second sub-pixel set, and third sub-pixels in the third sub-pixel set has a shape selected from a group consisting of a circle, an ellipse, and a polygon.

8. The pixel arrangement structure of claim 5, further comprising a first sub-pixel set, a second sub-pixel set, and a third sub-pixel set,
wherein the first sub-pixel set comprises: the first sub-pixel arranged in the i-th column, the first sub-pixel arranged in the (i+1)-th column, the first sub-pixel arranged in the (i+2)-th column, and the first sub-pixel arranged in the (i+3)-th column,
wherein the second sub-pixel set comprises: the second sub-pixel arranged in the i-th column, the second sub-pixel arranged in the (i+1)-th column, the second sub-pixel arranged in the (i+2)-th column, and the second sub-pixel arranged in the (i+3)-th column,
wherein the third sub-pixel set comprises: the third sub-pixel arranged in the i-th column, the third sub-pixel arranged in the (i+1)-th column, the third sub-pixel arranged in the (i+2)-th column, and the third sub-pixel arranged in the (i+3)-th column, and
wherein each of first sub-pixels in the first sub-pixel set, second sub-pixels in the second sub-pixel set, and third sub-pixels in the third sub-pixel set has a shape selected from a group consisting of a circle, an ellipse, and a polygon.

9. A display panel comprising pixels arranged in accordance with the pixel arrangement structure of claim 1.

10. The display panel of claim 9, wherein the display panel is selected from a group consisting of an organic luminescent display panel and a liquid crystal display panel.

11. The display panel of claim 9, further comprising a first sub-pixel set, a second sub-pixel set, and a third sub-pixel set,
- wherein the first sub-pixel set comprises: the one first sub-pixel arranged in the i-th column, the one first sub-pixel arranged in the (i+1)-th column, the one first sub-pixel arranged in the (i+2)-th column, and the one first sub-pixel arranged in the (i+3)-th column,
- wherein the second sub-pixel set comprises: the two second sub-pixels arranged in the i-th column, and the two second sub-pixels arranged in the (i+2)-th column,
- wherein the third sub-pixel set comprises: the two third sub-pixels arranged in the (i+1)-th column, and the two third sub-pixels arranged in the (i+3)-th column, and
- wherein the first sub-pixel set, the second sub-pixel set, and the third sub-pixel set are configured to emit light of different colors.

12. The display panel of claim 9, further comprising a first sub-pixel set, a second sub-pixel set, and a third sub-pixel set,
- wherein the first sub-pixel set comprises: the one first sub-pixel arranged in the i-th column, the one first sub-pixel arranged in the (i+1)-th column, the one first sub-pixel arranged in the (i+2)-th column, and the one first sub-pixel arranged in the (i+3)-th column,
- wherein the second sub-pixel set comprises: the two second sub-pixels arranged in the i-th column, and the two second sub-pixels arranged in the (i+2)-th column,
- wherein the third sub-pixel set comprises: the two third sub-pixels arranged in the (i+1)-th column, and the two third sub-pixels arranged in the (i+3)-th column, and
- wherein each of first sub-pixels in the first sub-pixel set, second sub-pixels in the second sub-pixel set, and third sub-pixels in third sub-pixel set has a shape selected from a group consisting of a circle, an ellipse, and a polygon.

* * * * *